United States Patent
Han et al.

(10) Patent No.: US 10,204,559 B2
(45) Date of Patent: Feb. 12, 2019

(54) SHIFT REGISTER UNIT, GATE DRIVING CIRCUIT AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Long Han, Beijing (CN); Bo Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 241 days.

(21) Appl. No.: 15/377,132

(22) Filed: Dec. 13, 2016

(65) Prior Publication Data
US 2017/0256203 A1 Sep. 7, 2017

(30) Foreign Application Priority Data
Mar. 1, 2016 (CN) .......................... 2016 1 0114666

(51) Int. Cl.
| G11C 19/00 | (2006.01) |
| G09G 3/3258 | (2016.01) |
| G09G 3/3266 | (2016.01) |
| G11C 19/28 | (2006.01) |
| H01L 27/32 | (2006.01) |
| G09G 3/36 | (2006.01) |

(52) U.S. Cl.
CPC ......... *G09G 3/3258* (2013.01); *G09G 3/3266* (2013.01); *G09G 3/3677* (2013.01); *G11C 19/28* (2013.01); *G11C 19/287* (2013.01); *H01L 27/3244* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| 2016/0275845 A1* | 9/2016 | Tsai ...................... G09G 3/3266 |
| 2017/0116926 A1* | 4/2017 | Bong ................... G09G 3/3266 |
| 2017/0193961 A1* | 7/2017 | Wang ..................... G09G 5/003 |
| 2017/0206824 A1* | 7/2017 | Sun ....................... G09G 3/2092 |
| 2017/0270860 A1* | 9/2017 | Wang ................... G09G 3/3258 |
| 2017/0278540 A1* | 9/2017 | Ozawa ............... G11B 20/1201 |
| 2017/0287423 A1* | 10/2017 | Yang .................. G09G 3/3688 |
| 2018/0082623 A1* | 3/2018 | Wang ................... G09G 3/3677 |

* cited by examiner

*Primary Examiner* — Tuan T Lam
(74) *Attorney, Agent, or Firm* — Ladas & Parry LLP (57) ABSTRACT

There is disclosed a shift register unit, a gate driving circuit and a display device. The shift register unit includes a shift register module configured to delay a phase of a signal from the input terminal, and output the delayed signal at the first output terminal; a first input module configured to set the first node to be at a second voltage level; a second input module configured to set the first node to be at the first voltage level, and apply the signal from the input terminal to the first node; and an output module configured to set the second output terminal to be at the second voltage level when the first output terminal is at the first voltage level, and set the second output terminal to be at the first voltage level when the first node is at the first voltage level.

19 Claims, 3 Drawing Sheets

FIG. 5

SHIFT REGISTER UNIT, GATE DRIVING CIRCUIT AND DISPLAY DEVICE

TECHNICAL FIELD

The present disclosure relates to the field of display technique, and, more particularly, to a shift register unit, a gate driving circuit and a display device.

BACKGROUND

As applied to an OLED (Organic Light-Emitting Display), AMOLED (Active-Matrix Organic Light-Emitting Diode) has been widely used in the field of high-performance display due to the advantages of high brightness, wide viewing angle, fast response speed, low power consumption etc. As known, most OLED products adopt a gate driving circuit to provide a gate driving signal to pixel circuits in each row, and each gate driving signal in each row is generated by one shift register unit, respectively. Therefore, although multiple gate driving signals can be provided as required, there is a redundancy in circuit structure and signal wiring in internal circuits of the gate driving circuit, which results in unnecessary expansion of layout space and increase of manufacturing cost.

SUMMARY

In view of the above, the present disclosure provides a shift register unit, a gate driving circuit and a display device, which can address the issue of expansion of layout space and increase of manufacturing cost due to the redundant circuit structure and signal wirings existing in internal circuits of the gate driving circuit.

In a first aspect, the present disclosure provides a shift register unit, comprising an input terminal, a first output terminal and a second output terminal, and further comprising:

a shift register module connected between the input terminal and the first output terminal, and configured to delay a phase of a signal from the input terminal under the control of a first clock signal, and output the delayed signal at the first output terminal;

a first input module connected between the first output terminal and a first node, and configured to set the first node to be at a second voltage level when a second clock signal and the first output terminal are both at a first voltage level;

a second input module connected between the input terminal and the first node, and configured to set the first node to be at the first voltage level when the first clock signal is at the first voltage level, and apply the signal from the input terminal to the first node when the second clock signal is at the first voltage level; and an output module connected between the first node, the first output terminal, and the second output terminal, and configured to set the second output terminal to be at the second voltage level when the first output terminal is at the first voltage level, and set the second output terminal to be at the first voltage level when the first node is at the first voltage level, wherein a phase of the first clock signal and a phase of the second clock signal are opposite to each other.

Optionally, the first input module comprises a first transistor and a second transistor, a gate of the first transistor is connected to the first output terminal, one of a source and a drain of the first transistor is connected to a first voltage line, and the other of a source and a drain of the first transistor is connected to one of a source and a drain of the second transistor; and a gate of the second transistor is connected to the second clock signal, and the other of a source and a drain of the second transistor is connected to the first node.

Optionally, the second input module comprises a third transistor and a fourth transistor, a gate of the third transistor is connected to the first clock signal, one of a source and a drain of the third transistor is connected to the first node, and the other of a source and a drain of the third transistor is connected to the second voltage line; and a gate of the fourth transistor is connected to the second clock signal, one of a source and a drain of the fourth transistor is connected to the input terminal, and the other of a source and a drain of the fourth transistor is connected to the first node.

Optionally, the output module comprises a fifth transistor and a sixth transistor, a gate of the sixth transistor is connected to the first output terminal, one of a source and a drain of the sixth transistor is connected to the first voltage line, and the other of a source and a drain of the sixth transistor is connected to the second output terminal; and a gate of the fifth transistor is connected to the first node, one of a source and a drain of the fifth transistor is connected to the second output terminal, and the other of a source and a drain of the fifth transistor is connected to the second voltage line.

Optionally, the shift register module comprises:

a first input sub-module connected between the input terminal and a second node, and configured to apply a signal from the input terminal to the second node when the first clock signal is at the first voltage level;

a second input sub-module connected between the second node and a third node, and configured to apply the first clock signal to the third node when the second node is at the first voltage level;

a third input sub-module connected to the third node, and configured to set the third node to be at the first voltage level when the first clock signal is at the first voltage level; and an output module connected between the second node, the third node and the first output terminal, and configured to set the first output terminal to be at the second voltage level when the third node is at the first voltage level, and set the first output terminal to be at the first voltage level when the second node is at the first voltage level.

Optionally, the first input sub-module comprises a seventh transistor, a gate of the seventh transistor is connected to the first clock signal, one of a source and a drain of the seventh transistor is connected to the input terminal, and the other of a source and a drain of the seventh transistor is connected to the second node.

Optionally, the second input sub-module comprises an eighth transistor, a gate of the eighth transistor is connected to the second node, one of a source and a drain of the eighth transistor is connected to the first clock signal, and the other of a source and a drain of the eighth transistor is connected to the third node.

Optionally, the third input sub-module comprises a ninth transistor, a gate of the ninth transistor is connected to the first clock signal, one of a source and a drain of the ninth transistor is connected to the second voltage line, and the other of a source and a drain of the ninth transistor is connected to the third node.

Optionally, the output sub-module comprises a tenth transistor, an eleventh transistor, a first capacitor and a second capacitor, wherein a gate of the tenth transistor is connected to the second node, one of a source and a drain of the tenth transistor is connected to the first output terminal, and the other of a source and drain of the tenth transistor is connected to the second clock signal;

a gate of the eleventh transistor is connected to the third node, one of a source and a drain of the eleventh transistor is connected to the first voltage line, and the other of a source and a drain of the eleventh transistor is connected to the first output terminal;

the first capacitor is connected between the first output terminal and the second node; and the second capacitor is connected between the first voltage line and the third node.

In a second aspect, the present disclosure further provides a gate driving circuit, comprising a plurality of stages of shift register units described above; except a first stage, an input terminal of a shift register unit in any stage is connected to a first output terminal of a shift register unit in a previous stage; a first clock signal and a second clock signal of shift register units in two adjacent stages are exchanged with each other.

In a third aspect, the present disclosure further provides a display device, comprising the gate driving circuit described above.

It can be known from the above technical solutions that, in the present disclosure, the output of a gate driving signal in a first stage is realized based on the shift register module, and the output of a gate driving signal in a second stage is generated based on the first input module, the second input module and the output module and by using a signal at the input terminal and a signal at the first output terminal. Therefore, in the present disclosure, the output of two gate driving signals can be implemented in a single shift register unit, in comparison to a manner of adopting two shift register units to output two gate driving signal separately, the circuit structure is simplified in the present disclosure, which is beneficial to narrowing the layout space and reducing the manufacturing cost.

BRIEF DESCRIPTION OF THE DRAWINGS

In order to more clearly illustrate the technical solutions in the embodiments of the present disclosure or the known technical solutions, drawings necessary for illustration will be briefly introduced below, obviously, the following drawings are parts of embodiments of the present disclosure, and for those of ordinary skill in the art, it is possible to obtain other drawings based on these drawings without paying creative efforts.

DETAILED DESCRIPTION OF THE EMBODIMENTS

To make the objects, technical solutions, and advantages of the present disclosure more clear, hereinafter, the technical solutions in the embodiments of the present disclosure will be described clearly and comprehensively in combination with the drawings thereof, obviously, these described embodiments are parts of the embodiments of the present disclosure, rather than all of the embodiments thereof. All the other embodiments obtained by those of ordinary skill in the art based on the embodiments of the present disclosure without paying creative efforts fall into the protection scope of the present disclosure.

Figure 1:
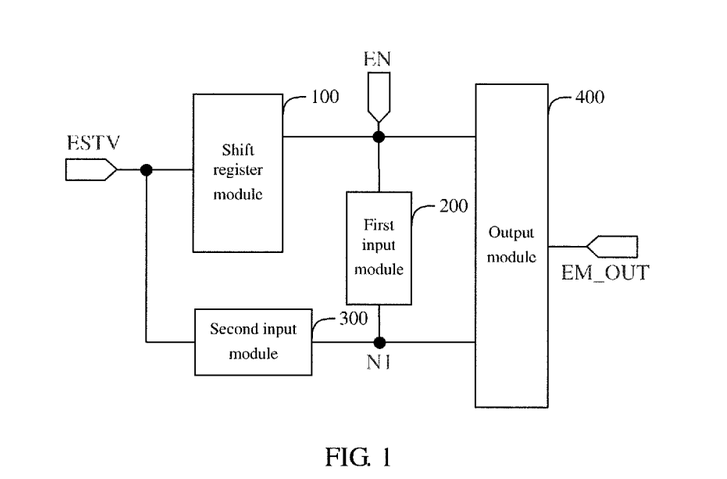
FIG. 1 is a block diagram of a configuration of a shift register unit provided by an embodiment of the present disclosure.

FIG. 1 is a block diagram of a configuration of a shift register unit provided by an embodiment of the present disclosure. As illustrated in FIG. 1, a shift register unit provided by an embodiment of the present disclosure comprises signal connection terminals such as an input terminal ESTV, a first output terminal EN and a second output terminal EM_OUT, and further comprises:

a shift register module 100 connected between the input terminal ESTV and the first output terminal EN, and configured to delay a phase of a signal from the input terminal ESTV under the control of a first clock signal, and output the delayed signal at the first output terminal EN;

a first input module 200 connected between the first output terminal EN and a first node N1, and configured to set the first node N1 to be at a second voltage level when a second clock signal and the first output terminal EN are both at a first voltage level;

a second input module 300 connected between the input terminal ESTV and the first node N1, and configured to set the first node N1 to be at the first voltage level when the first clock signal is at the first voltage level, and connect the signal from the input terminal ESTV to the first node N1 when the second clock signal is at the first voltage level; and an output module 400 connected between the first node N1, the first output terminal EN, the second output terminal EM_OUT, and configured to set the second output terminal EM_OUT to be at the second voltage level when the first output terminal EN is at the first voltage level, and set the second output terminal EM_OUT to be at the first voltage level when the first node N1 is at the first voltage level, wherein the first clock signal and the second clock signal are forward and backward clock signals respectively.

It is to be understood that the "first voltage level" and the "second voltage level" are referred to herein a high voltage level and a low voltage level, respectively, and when the first voltage level is a high voltage level, the second voltage level is a low voltage level, and when the first voltage level is a low voltage level, the second voltage level is a high voltage level. The aforesaid high and low voltage levels can be referred to two preset potentials that are higher and lower relative to each other, and can be set by those skilled in the art depending on a device as selected and a circuit configuration as adopted, the present disclosure makes no limitations thereto.

It is to be understood that the "forward clock signal" and the "backward clock signal" are referred to herein are a pair of clock signals inverted to each other, when the forward clock signal is at a low voltage level, the backward clock signal is at a high voltage level, and when the forward clock signal is at a high voltage level, the backward clock signal is at a low voltage level. It can be set by those skilled in the art depending on a device as selected and a circuit configuration as adopted, and the present disclosure makes no limitations thereto.

In order to more clearly illustrate the structures and functions of the above respective modules, take the case in which the first voltage level is a low voltage level and the second voltage level is a high voltage level as example, an operating principle of the shift register unit will be briefly introduced below, referring to FIG. 4.

In a first period, the first clock signal is at a low voltage level, the second clock signal is at a high voltage level, and a signal input at the input terminal ESTV is just changed from a high voltage level to a low voltage level. At this time, the shift register module 100 outputs a phase-delayed signal, thus a signal outputted by the first output terminal EN in this period remains a high voltage level. Thereby, either of the second clock signal and the first output terminal EN is at a high voltage level, so that the first input module 200 has no effect on the first node N1. And under the effect of a low voltage level of the first clock signal, the second input module 300 sets the first node N1 to be at a low voltage level, and under the effect of a low voltage level of the first node N1, the output module 400 outputs a low voltage level to the second output terminal EM_OUT.

In a second period, the first clock signal is at a high voltage level, the second clock signal is at a low voltage level, and a signal input at the input terminal ESTV is just changed from a low voltage level to a high voltage level. At this time, the shift register module 100 outputs a phase-delayed signal, and thus a low voltage level is outputted to the first output terminal EN in this period. Thereby, the second clock signal and the first output terminal EN are both at a low voltage level, so that the first input module 200 sets the first node N1 to be at a high voltage level. And under the effect of a low voltage level of the second clock signal, the second input module 300 inputs a high voltage level from the input terminal ESTV to the first node N1, and further maintains the first node N1 at a high voltage level. Thus under the effects of a high voltage level of the first node N1 and a low voltage level of the first output terminal EN, the output module 400 outputs a high voltage level to the second output terminal EM_OUT.

In a third period, the first clock signal is a low voltage level, the second clock signal is a high voltage level, and a signal input at the input terminal ESTV is maintained at a high voltage level. In this case, the shift register module 100 makes a signal outputted from the first output terminal EN be a high voltage level. Thereby, either of the second clock signal and the first output terminal EN is at a high voltage level, so that the first input module 200 has no effect on the first node N1. And under the effect of a low voltage level of the first clock signal, the second input module 300 sets the first node N1 to be at a low voltage level, and under the effect of a low voltage level of the first node N1, the output module 400 outputs a low voltage level to the second output terminal EM_OUT.

As will be appreciated, the above-described respective modules can be implemented by a circuit that includes electrically-controlled switching elements, wherein the electrically-controlled switching element can be any electronic device in which a voltage change between two circuit nodes can be controlled by an electrical signal.

It can be seen that, in the embodiment of the present disclosure, a first stage output of a gate driving signal can be outputted (at the first output terminal EN) based on the shift register module 100, and a second stage output of a gate driving signal can be generated (at the second output terminal EM_OUT) based on the first input module 200, the second input module 300 and the output module 400 by using a signal at the input terminal ESTV and a signal at the first output terminal EN. Therefore, in the present disclosure, it can be implemented that two stages of gate driving signals are outputted in a single shift register unit, in comparison to a manner of adopting two shift register units to output gate driving signal separately, the circuit structure can be simplified in the embodiment of the present disclosure, which contributes to downsizing the layout space and reducing the manufacturing cost.

Figure 2:
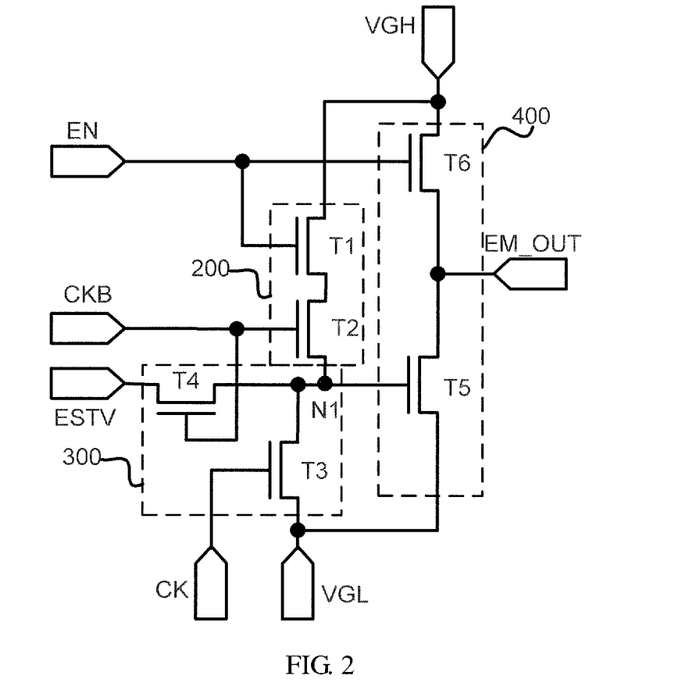
FIG. 2 is a partial circuit configuration diagram of the shift register unit illustrated in FIG. 1.
Figure 3:
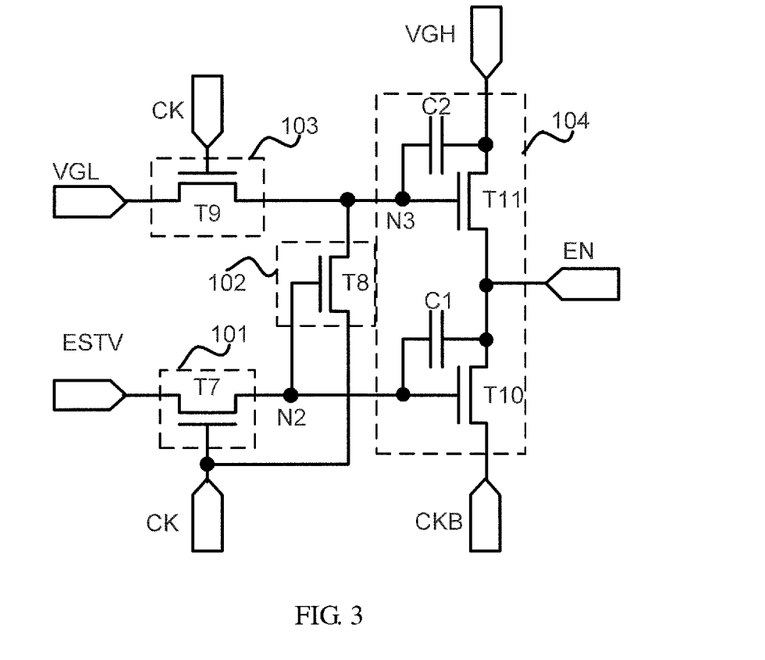
FIG. 3 is a circuit configuration diagram of the shift register module illustrated in FIG. 1.

As a specific example, FIGS. 2 and 3 illustrate a schematic diagram of circuit configuration of a shift register unit provided by an embodiment of the present disclosure. As illustrated in FIG. 2:

As a specific example of an internal structure of the first input module 200, in the embodiment of the present disclosure, a first transistor T1 and a second transistor T2 are disposed in the first input module 200.

A gate of the first transistor T1 is connected to the first output terminal EN, one of a source and a drain of the first transistor T1 is connected to a first voltage line VGH, and the other of a source and a drain of the first transistor T1 is connected to one of a source and a drain of the second transistor T2; and a gate of the second transistor T2 is connected to the second clock signal CKB, and the other of a source and a drain of the second transistor T2 is connected to the first node N1.

It is to be noted that the transistors adopted in the embodiment of the present disclosure can be thin film transistors or field effect transistors or other devices having the same characteristics. In a case in which the source and the drain of the adopted transistors are of a symmetrical structure, the source and the drain can be not differentiated in particular. As an example, each transistor in the embodiment of the present disclosure is turned on when the gate thereof is connected to a low voltage level, and the source and the drain of each transistor are not differentiated. Those skilled in the art can determine the source and the drain of respective transistors in a particular application circuit according to the corresponding function, no more details are described here.

It will be appreciated that, in the embodiment of the present disclosure, since the transistor is turned on by a low voltage level, thus the first voltage level is a low voltage level, and can be input from the second voltage line VGL; the second voltage level is a high voltage level, and can be input from the first voltage line VGH. Thus, when the first output terminal EN and the second clock signal CKB are both at a low voltage level, the first transistor T1 and the second transistor T2 can be turned on to form a path in which a current flows from the first voltage line VGH to the first node N1, thereby achieving the function that the first input module 200 sets the first node N1 to be at a high voltage level.

As a specific example of an internal structure of the second input module 300, in the embodiment of the present disclosure, a third transistor T3 and a fourth transistor T4 are disposed in the second input module 300.

A gate of the third transistor T3 is connected to the first clock signal CK, one of a source and a drain of the third transistor T3 is connected to the first node N1, and the other of a source and a drain of the third transistor T3 is connected to the second voltage line VGL; and a gate of the fourth transistor T4 is connected to the second clock signal CKB, one of a source and a drain of the fourth transistor T4 is connected to the input terminal ESTV, and the other of a source and a drain of the fourth transistor T4 is connected to the first node N1.

Thereby, the first node N1 can be set to be at a low voltage level when the first clock signal CK is at a low voltage level, and a signal from the input terminal ESTV can be applied to the first node N1 when the second clock signal CKB is at a low voltage level, so that the function of the second input module 300 as described above is achieved.

As a specific example of an internal structure of the output module 400, in the embodiment of the present disclosure, a fifth transistor T5 and a sixth transistor T6 are disposed in the output module 400.

A gate of the sixth transistor T6 is connected to the first output terminal EN, one of a source and a drain of the sixth transistor T6 is connected to the first voltage line VGH, and the other of a source and a drain of the sixth transistor T6 is connected to the second output terminal EM_OUT; and a gate of the fifth transistor T5 is connected to the first node N1, one of a source and a drain of the fifth transistor T5 is connected to the second output terminal EM_OUT, and the other of a source and a drain of the fifth transistor T5 is connected to the second voltage line VGL.

Thereby, the second output terminal EM_OUT can be set at a high voltage level when the first output terminal EN is at a low voltage level, and the second output terminal EM_OUT can be set as a low voltage level when the first node N1 is at a low voltage level, so that he function of the output module 400 as described above is achieved.

Referring to FIG. 3, as a specific example of an internal structure of the shift register unit 100, the shift register unit 100 in the embodiment of the present disclosure comprises:

a first input sub-module 101 connected between the input terminal ESTV and a second node N2, and configured to apply the signal from the input terminal ESTV to the second node N2 when the first clock signal is at the first voltage level;

a second input sub-module 102 connected between the second node N2 and a third node N3, and configured to apply the first clock signal CK to the third node N3 when the second node N2 is at the first voltage level;

a third input sub-module 103 connected to the third node N3, and configured to set the third node N3 to be at the first voltage level when the first clock signal CK is at the first voltage level; and an output sub-module 104 connected between the second node N2, the third node N3 and the first output terminal EN, and configured to set the first output terminal EN to be at the second voltage level when the third node N3 is at the first voltage level, and set the first output terminal EN to be at the first voltage level when the second node N2 is at the first voltage level.

As a specific example of an internal structure of the first input sub-module 101, a seventh transistor T7 is disposed within the first input sub-module 101 in an embodiment of the present disclosure. A gate of the seventh transistor T7 is connected to the first clock signal CK, one of a source and a drain of the seventh transistor T7 is connected to the input terminal ESTV, and the other of a source and a drain of the seventh transistor T7 is connected to the second node. N2.

As a specific example of an internal structure of the second input sub-module 102, an eighth transistor T8 is disposed within the second input sub-module 102 in an embodiment of the present disclosure. A gate of the eighth transistor T8 is connected to the second node N2, one of a source and a drain of the eighth transistor T8 is connected to the first clock signal CK, and the other of a source and a drain of the eighth transistor T8 is connected to the third node N3.

As a specific example of an internal structure of the third input sub-module 103, a ninth transistor T9 is disposed within the third input sub-module 103 in an embodiment of the present disclosure. A gate of the ninth transistor T9 is connected to the first clock signal CK, one of a source and a drain of the ninth transistor T9 is connected to the second voltage line VGL, and the other of a source and a drain of the ninth transistor T9 is connected to the third node N3.

As a specific example of an internal structure of the fourth input sub-module 104, a tenth transistor T10, an eleventh transistor T11, a first capacitor C1 and a second capacitor C2 are disposed within the output sub-module 104, wherein a gate of the tenth transistor T10 is connected to the second node N2, one of a source and a drain of the tenth transistor T10 is connected to the first output terminal EN, and the other of a source and a drain of the tenth transistor T10 is connected to the second clock signal CKB;

a gate of the eleventh transistor T11 is connected to the third node N3, one of a source and a drain of the eleventh transistor T11 is connected to the first voltage line VGH, and the other of a source and a drain of the eleventh transistor T11 is connected to the first output terminal EN;

the first capacitor C1 is connected between the first output terminal EN and the second node N2; and the second capacitor C2 is connected between the first voltage line VGH and the third node N3.

Figure 4:
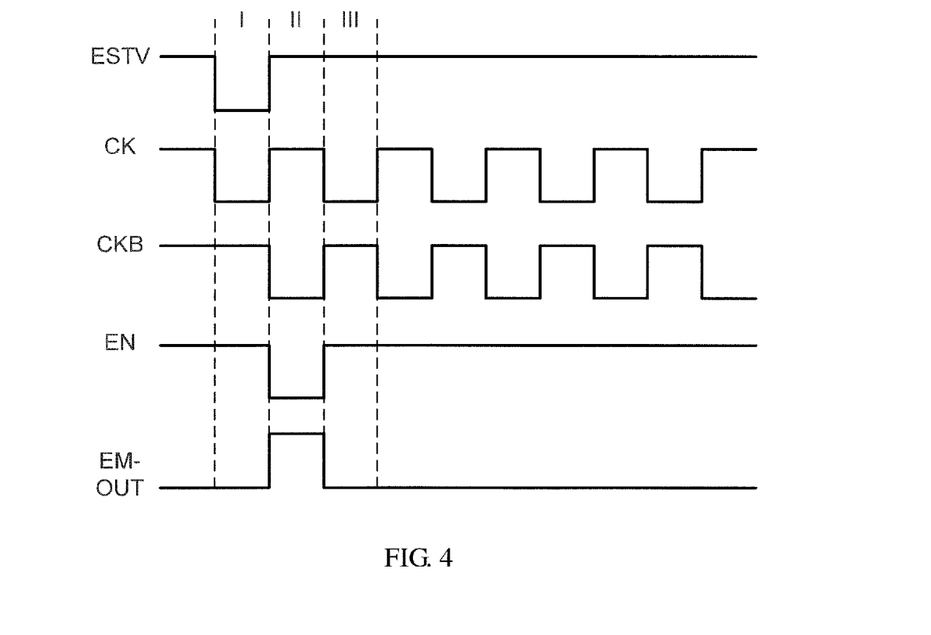
FIG. 4 is a circuit timing diagram of the shift register unit illustrated in FIGS. 2 and 3.

FIG. 4 is a circuit timing diagram of the shift register unit illustrated in FIGS. 1-3. As illustrated in FIG. 4, an operating process of a shift register unit provided by the embodiment of the present disclosure comprises:

Period I in which when the first clock signal CK is at a low voltage level, the ninth transistor T9 is turned on, a potential at the third node N3 is set to be at a low voltage level because of writing of a low voltage to which the second voltage line VGL is connected. In this case, the eleventh transistor T11 is turned on, a high voltage level to which the first voltage line VGH is connected is outputted at the first output terminal EN via the eleventh transistor T11. In addition, there is a voltage difference between two electrodes of the second capacitor C2 to charge the second capacitor C2.

Since the first clock signal CK is at a low voltage level, the seventh transistor T7 is turned on, the second node N2 is set to be at a low voltage level because of writing of a low voltage signal to which the input terminal ESTV is connected. In this case, the eighth transistor T8 and the tenth transistor T10 are turned on, the first clock signal CK maintains the second node N3 to be at a low voltage level via the eighth transistor T8, meanwhile the high voltage level of the second clock signal CKB maintains a signal outputted at the first output terminal EN to be at a high voltage level via the tenth transistor T10. In addition, there is a voltage difference between two electrodes of the first capacitor C1 to charge the first capacitor C1.

As illustrated in FIG. 2, the first clock signal CK is at a low voltage level, the third transistor T3 is turned on, the first node N1 is set to be at a low voltage level because of writing of the low voltage to which the second voltage line VGL is connected. In this case, the fifth transistor T5 is turned on, the low voltage level to which the second voltage line VGL is connected is outputted at the second output terminal EM_OUT. Since the signal outputted at the first output terminal EN is at a high voltage level, the first transistor T1 and the sixth transistor T6 are maintained in a turning-off state. The second clock signal CKB is at a high voltage level, the second transistor T2 and the fourth T4 are maintained in the turning-off state, thereby it is ensured that the signal outputted at the second output terminal EM_OUT is at a low voltage level.

Period II in which a signal to which the inputted terminal ESTV is connected and the first clock signal CK are both at a high voltage level, the seventh transistor T7 is turned off. Since the first capacitor C1 is charged in period I, so that the second node is maintained in a low voltage level state, in this case, the tenth transistor T10 is turned on. The first output terminal EN outputs the second clock signal CKB which is at a low voltage level. Since the second node N2 is maintained at a low voltage level, the eighth transistor T8 is turned on, the third node N3 is pulled up to be at a high voltage level because of inputting of the first clock signal CK, so that the eleventh transistor T11 is turned off, so as to ensure that the signal outputted by at first output terminal EN is at a low voltage level.

Under the effect of the low voltage level of the signal outputted at the first output terminal EN, the sixth transistor T6 is turned on, the second output terminal EM_OUT outputs a high voltage level to which the first voltage line VGH is connected. Since the first clock signal CK is at a high voltage level, the third transistor T3 is turned off. The second clock signal CKB is at a low voltage level, the second transistor T2 and the fourth transistor T4 are turned on, in this case, since the signal to which the input terminal ESTV is connected is at a high voltage level, under the effect of which, the first node N1 is pulled up to a high voltage level, the fifth transistor T5 is turned off, so as to ensure that the signal outputted at the second output terminal EM_OUT is at a high voltage level. The first transistor T1 and the second transistor T2 are turned on at the same time so as to ensure that the potential at the first node N1 is at a high voltage level.

Period III: the first clock signal CK is at a low voltage level, the seventh transistor T7 is turned on, the potential at the second node N2 is set as a high voltage level because of writing of the high voltage to which the input terminal ESTV is connected, in this case, the eighth transistor T8 and the tenth transistor T10 are turned off. The ninth transistor T9 is turned on, a potential at the third node N3 is set as a low voltage level because of writing of a low voltage to which the second voltage line VGL is connected, the eleventh transistor T11 is turned on, in this case, the signal outputted at the first output terminal EN is a high voltage level.

The first clock signal CK is a low voltage level, the third transistor T3 is turned on, a voltage level at the first node N1 is set as a low voltage level because of writing of a low voltage level to which the second voltage line VGL is connected, the fifth transistor T5 is turned on, in this case, the signal outputted at the second output terminal EM_OUT is a low voltage level. Since the signal outputted at the first output terminal EN is a high voltage level, the first transistor T1 and the sixth transistor T6 are turned off, having no effect on the output of the second output terminal EM_OUT. When the second clock signal CKB is at a high voltage level, the second transistor T2 and the fourth transistor T4 are turned off, having no effect on the potential at the node N1.

The shift register unit provided by the embodiment of the present disclosure can be implemented with eleven transistors and two capacitors, wherein the fifth transistor T5, the sixth transistor T6, the tenth transistor T10 and the eleventh transistor T11 serve as output transistors and output signals at the first output terminal and the second output terminal. That is to say, the embodiment of the present disclosure can output two gate driving signals in one shift register unit. In comparison to a manner of adopting two shift register units to output two gate driving signal separately, the present disclosure can simplify the circuit structure, which is beneficial to narrowing the layout space and reducing the manufacturing cost. In addition, a signal outputted at the first output terminal EN can further serve as an input of a next stage, thereby implementing association of two gate driving signals, and ensuring reliability of the output signal.

Figure 5:
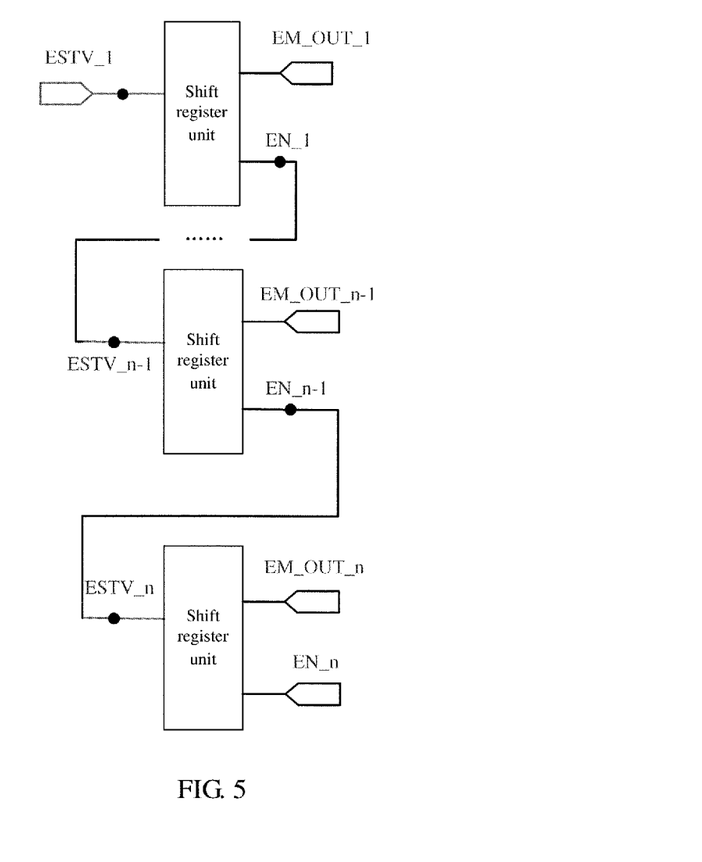
FIG. 5 is a block diagram of a configuration of a gate driving circuit provided by an embodiment of the present disclosure.

FIG. 5 is a block diagram of a gate driving circuit provided by an embodiment of the present disclosure. As illustrated in FIG. 5, the gate driving circuit comprises a plurality of stages of any of the shift register units described above; except a first stage, an input terminal ESTV_n of a shift register unit in any stage is connected to a first output terminal EN_n−1 of a shift register unit in a previous stage. And in order to ensure timing consistency in a plurality of stages of shift register units, except the first stage, a first clock signal of the register unit in any stage and a first clock signal of the shift register unit in a previous stage function as a forward clock signal and an backward clock signal, respectively (that is, a first clock signal and a second clock signal of shift register units in two adjacent stages are set opposite to each other). Herein, n is a positive integer larger than or equal to 1.

Based on the same inventive concept, an embodiment of the present application further provides a display device, comprising any of the gate driving circuit described above. The display device in the embodiment can be a display panel, a mobile phone, a tablet computer, a television, a notebook computer, a digital photo frame, a navigation system and any other products or components having a display function. Since the display device comprises any of the gate driving circuit described above, it can solve the same technical problem and achieve the same technical effect, details of which are omitted here.

In the specification of the present disclosure, a large amount of specific details are explained. It is to be understood, however, that the embodiment of the present disclosure can be practiced without these specific details. In some examples, well-known methods, structures, and techniques are not illustrated in detail in order to not obscure understanding of this specification.

Similarly, it shall be appreciated that in order to simplify the present disclosure and help the understanding of one or more of all the inventive aspects, in the above description of the exemplary embodiments of the present disclosure, sometimes individual features of the present disclosure are grouped together into a single embodiment, figure or the description thereof. However, the disclosed methods should not be construed as reflecting the following intention, namely, the claimed disclosure claims more features than those explicitly recited in each claim. More precisely, as reflected in the claims, an aspect of the present disclosure lies in being less than all the features of individual embodiments disclosed previously. Therefore, the claims complying with a particular implementation are hereby incorporated into the particular implementation, wherein each claim itself acts as an individual embodiment of the present disclosure.

In the description of the present disclosure, it should be noted that orientation or position relationships indicated by the terms "above", "under" etc. are orientation or position illustrated based on the drawings, which are only to facilitate describing the present disclosure and simplifying the description, rather than to indicate or imply that the device or element referred must have a particular orientation, constructed or operated with a particular orientation, and therefore cannot be construed as limiting the present disclosure. Unless otherwise expressly specified and limited, the terms "installation", "connected", "connection" should be broadly understood, for example, it can be fixedly connected, or removably connected, or integrally connected; it can also be mechanically connected, or electrically connected; it can also be directly connected, or indirectly connected through an middleware, or two components can be internally communicated. For those of ordinary skill in the art, the meaning of the aforesaid terms in the present disclosure should be understood according to practice.

It should be also noted that, in the specification, the relationship terms such as "first", "second", and so on are used only to differentiate one entity or operation from another entity or operation, not necessarily requiring or implying that these entities or operations have any of such actual relationships or sequences. And the terms "comprise", "include" and any other variations thereof intend to cover nonexclusive inclusion so that the procedure, the method, the product or the equipment including a series of elements include not only these elements, but also other elements which are not listed explicitly, or also include inherent elements of these procedure, method, product or equipment. In the case that there is no further limitation, elements defined by the expressions "comprise a . . . " do not exclude there being additional identity elements in the procedure, method, product or equipment of the elements.

The above embodiments are merely exemplary ones adopted for explaining the technical solutions of the present disclosure, rather than limiting the present disclosure. Although the present disclosure has been described in detail with reference to the embodiments provided above, those of ordinary skill in the art should understand that various modifications can also be made to the technical solutions disclosed in the preceding embodiments, or parts of the technical features thereof can be replaced by equivalents, and essence of the corresponding technical solutions with these modifications or replacements still falls into the spirit and scope of the embodiments of the present disclosure.

The present application claims priority of the Chinese Patent Application No. 201610114666.9 filed on Mar. 1, 2016, the entire disclosure of which is hereby incorporated in full text by reference as part of the present application.

What is claimed is:

1. A shift register unit, comprising an input terminal, a first output terminal and a second output terminal, and further comprising:
   a shift register module connected between the input terminal and the first output terminal, and configured to delay a phase of a signal from the input terminal under a control of a first clock signal, and output the delayed signal at the first output terminal;
   a first input module connected between the first output terminal and a first node, and configured to set the first node to be at a second voltage level when a second clock signal and the first output terminal are both at a first voltage level;
   a second input module connected between the input terminal and the first node, and configured to set the first node to be at the first voltage level when the first clock signal is at the first voltage level, and apply the signal from the input terminal to the first node when the second clock signal is at the first voltage level; and
   an output module connected between the first node, the first output terminal, and the second output terminal, and configured to set the second output terminal to be at the second voltage level when the first output terminal is at the first voltage level, and set the second output terminal to be at the first voltage level when the first node is at the first voltage level,
   wherein a phase of the first clock signal and a phase of the second clock signal are opposite to each other.

2. The shift register unit according to claim 1, wherein the first input module comprises a first transistor and a second transistor,
   a gate of the first transistor is connected to the first output terminal, one of a source and a drain of the first transistor is connected to a first voltage line, and the other of the source and the drain of the first transistor is connected to one of a source and a drain of the second transistor; and
   a gate of the second transistor is connected to the second clock signal, and the other of the source and the drain of the second transistor is connected to the first node.

3. The shift register unit according to claim 2, wherein the second input module comprises a third transistor and a fourth transistor,
   a gate of the third transistor is connected to the first clock signal, one of a source and a drain of the third transistor is connected to the first node, and the other of the source and the drain of the third transistor is connected to a second voltage line; and
   a gate of the fourth transistor is connected to the second clock signal, one of a source and a drain of the fourth transistor is connected to the input terminal, and the other of the source and the drain of the fourth transistor is connected to the first node.

4. The shift register unit according to claim 3, wherein the output module comprises a fifth transistor and a sixth transistor,
   a gate of the sixth transistor is connected to the first output terminal, one of a source and a drain of the sixth transistor is connected to the first voltage line, and the other of the source and the drain of the sixth transistor is connected to the second output terminal; and
   a gate of the fifth transistor is connected to the first node, one of a source and a drain of the fifth transistor is connected to the second output terminal, and the other of the source and the drain of the fifth transistor is connected to the second voltage line.

5. The shift register unit according to claim 1, wherein the shift register module comprises:
   a first input sub-module connected between the input terminal and a second node, and configured to apply the signal from the input terminal to the second node when the first clock signal is at the first voltage level;
   a second input sub-module connected between the second node and a third node, and configured to apply the first clock signal to the third node when the second node is at the first voltage level;
   a third input sub-module connected to the third node, and configured to set the third node to be at the first voltage level when the first clock signal is at the first voltage level; and
   an output sub-module connected between the second node, the third node and the first output terminal, and configured to set the first output terminal to be at the second voltage level when the third node is at the first voltage level, and set the first output terminal to be at the first voltage level when the second node is at the first voltage level.

6. The shift register unit according to claim 5, wherein the first input sub-module comprises a seventh transistor, a gate of the seventh transistor is connected to the first clock signal, one of a source and a drain of the seventh transistor is connected to the input terminal, and the other of the source and the drain of the seventh transistor is connected to the second node.

7. The shift register unit according to claim 6, wherein the second input sub-module comprises an eighth transistor, a gate of the eighth transistor is connected to the second node, one of a source and a drain of the eighth transistor is connected to the first clock signal, and the other of the source and the drain of the eighth transistor is connected to the third node.

8. The shift register unit according to claim 7, wherein the third input sub-module comprises a ninth transistor, a gate of the ninth transistor is connected to the first clock signal, one of a source and a drain of the ninth transistor is connected to the second voltage line, and the other of the source and the drain of the ninth transistor is connected to the third node.

9. The shift register unit according to claim 8, wherein the output sub-module comprises a tenth transistor, an eleventh transistor, a first capacitor and a second capacitor, wherein
a gate of the tenth transistor is connected to the second node, one of a source and a drain of the tenth transistor is connected to the first output terminal, and the other of the source and the drain of the tenth transistor is connected to the second clock signal;
a gate of the eleventh transistor is connected to the third node, one of a source and a drain of the eleventh transistor is connected to the first voltage line, and the other of the source and the drain of the eleventh transistor is connected to the first output terminal;
the first capacitor is connected between the first output terminal and the second node; and
the second capacitor is connected between the first voltage line and the third node.

10. A gate driving circuit, comprising a plurality of stages of shift register units according to claim 1; except a first stage, an input terminal of a shift register unit in any stage is connected to a first output terminal of a shift register unit in a previous stage; a first clock signal and a second clock signal of shift register units in two adjacent stages are exchanged with each other.

11. A display device, comprising the gate driving circuit according to claim 10.

12. The gate driving circuit according to claim 10, wherein the first input module comprises a first transistor and a second transistor,
a gate of the first transistor is connected to the first output terminal, one of a source and a drain of the first transistor is connected to a first voltage line, and the other of the source and the drain of the first transistor is connected to one of a source and a drain of the second transistor; and
a gate of the second transistor is connected to the second clock signal, and the other of the source and the drain of the second transistor is connected to the first node.

13. The gate driving circuit according to claim 12, wherein the second input module comprises a third transistor and a fourth transistor,
a gate of the third transistor is connected to the first clock signal, one of a source and a drain of the third transistor is connected to the first node, and the other of the source and the drain of the third transistor is connected to a second voltage line; and
a gate of the fourth transistor is connected to the second clock signal, one of a source and a drain of the fourth transistor is connected to the input terminal, and the other of the source and the drain of the fourth transistor is connected to the first node.

14. The gate driving circuit according to claim 13, wherein the output module comprises a fifth transistor and a sixth transistor,
a gate of the sixth transistor is connected to the first output terminal, one of a source and a drain of the sixth transistor is connected to the first voltage line, and the other of the source and the drain of the sixth transistor is connected to the second output terminal; and
a gate of the fifth transistor is connected to the first node, one of a source and a drain of the fifth transistor is connected to the second output terminal, and the other of the source and the drain of the fifth transistor is connected to the second voltage line.

15. The gate driving circuit according to claim 10, wherein the shift register module comprises:
a first input sub-module connected between the input terminal and a second node, and configured to apply a signal from the input terminal to the second node when the first clock signal is at the first voltage level;
a second input sub-module connected between the second node and a third node, and configured to apply the first clock signal to the third node when the second node is at the first voltage level;
a third input sub-module connected to the third node, and configured to set the third node to be at the first voltage level when the first clock signal is at the first voltage level; and
an output sub-module connected between the second node, the third node and the first output terminal, and configured to set the first output terminal to be at the second voltage level when the third node is at the first voltage level, and set the first output terminal to be at the first voltage level when the second node is at the first voltage level.

16. The gate driving circuit according to claim 15, wherein the first input sub-module comprises a seventh transistor, a gate of the seventh transistor is connected to the first clock signal, one of a source and a drain of the seventh transistor is connected to the input terminal, and the other of the source and the drain of the seventh transistor is connected to the second node.

17. The gate driving circuit according to claim 16, wherein the second input sub-module comprises an eighth transistor, a gate of the eighth transistor is connected to the second node, one of a source and a drain of the eighth transistor is connected to the first clock signal, and the other of the source and the drain of the eighth transistor is connected to the third node.

18. The gate driving circuit according to claim 17, wherein the third input sub-module comprises a ninth transistor, a gate of the ninth transistor is connected to the first clock signal, one of a source and a drain of the ninth transistor is connected to the second voltage line, and the other of the source and the drain of the ninth transistor is connected to the third node.

19. The gate driving circuit according to claim 18, wherein the output sub-module comprises a tenth transistor, an eleventh transistor, a first capacitor and a second capacitor, wherein
a gate of the tenth transistor is connected to the second node, one of a source and a drain of the tenth transistor is connected to the first output terminal, and the other of the source and the drain of the tenth transistor is connected to the second clock signal;

a gate of the eleventh transistor is connected to the third node, one of a source and a drain of the eleventh transistor is connected to the first voltage line, and the other of the source and the drain of the eleventh transistor is connected to the first output terminal;

the first capacitor is connected between the first output terminal and the second node; and the second capacitor is connected between the first voltage line and the third node.

* * * * *